(12) United States Patent
Nishida et al.

(10) Patent No.: US 8,351,210 B2
(45) Date of Patent: Jan. 8, 2013

(54) ELECTRONIC APPARATUS

(75) Inventors: Noboru Nishida, Ome (JP); Yuuji Iwasaki, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 262 days.

(21) Appl. No.: 12/912,369

(22) Filed: Oct. 26, 2010

(65) Prior Publication Data

US 2011/0199734 A1    Aug. 18, 2011

(30) Foreign Application Priority Data

Feb. 12, 2010   (JP) ................................. 2010-029220

(51) Int. Cl.
*H05K 7/20* (2006.01)
*H01L 23/40* (2006.01)

(52) U.S. Cl. ............... 361/720; 361/679.46; 361/679.54; 361/704; 361/709; 361/719; 361/711; 165/80.1; 165/80.2; 165/80.3; 165/185; 174/16.3; 257/706; 257/707; 257/713; 257/717; 257/723

(58) Field of Classification Search ............ 361/679.46–679.55, 702–724; 165/80.1–80.5, 104.33, 165/104.34, 185; 257/706–727; 174/15.1, 174/16.3, 252; 24/297, 453–458, 500, 502, 24/505, 510, 625; 411/352, 353, 152, 153, 411/544

See application file for complete search history.

(56) References Cited

U.S. PATENT DOCUMENTS

| | | | |
|---|---|---|---|
| 5,995,370 A | 11/1999 | Nakamori | |
| 6,603,665 B1 * | 8/2003 | Truong et al. | 361/752 |
| 6,858,792 B2 * | 2/2005 | Franz et al. | 174/16.1 |
| 6,898,081 B2 * | 5/2005 | Liu et al. | 361/679.46 |
| 7,321,492 B2 * | 1/2008 | Wang et al. | 361/709 |
| 7,333,342 B2 * | 2/2008 | Saito | 361/719 |
| 7,684,198 B2 * | 3/2010 | Fang | 361/719 |
| 2004/0026777 A1 | 2/2004 | Yokoyama et al. | |
| 2005/0117307 A1 * | 6/2005 | Tanaka | 361/719 |
| 2006/0181852 A1 * | 8/2006 | Frank et al. | 361/704 |
| 2009/0067134 A1 | 3/2009 | Tanaka | |
| 2011/0199734 A1 | 8/2011 | Nishida et al. | |

FOREIGN PATENT DOCUMENTS

| | | |
|---|---|---|
| JP | 07-212066 | 8/1995 |
| JP | 07-288302 | 10/1995 |
| JP | 8-130385 | 5/1996 |
| JP | 08-139235 | 5/1996 |
| JP | 10-107189 | 4/1998 |
| JP | 11-074427 | 3/1999 |
| JP | 3-057715 | 6/1999 |
| JP | 2001-237578 | 8/2001 |

(Continued)

OTHER PUBLICATIONS

Japanese Patent Application No. 2011-207837; Notice of Reasons for Rejection; Mailed Dec. 20, 2011 (with English translation).

(Continued)

*Primary Examiner* — Michail V Datskovskiy
(74) *Attorney, Agent, or Firm* — Blakely, Sokoloff, Taylor & Zafman LLP

(57) ABSTRACT

According to one embodiment, an electronic apparatus includes a housing, a circuit board in the housing, a heat sink, and a fixing portion. The circuit board includes a heating component. The heat sink has a plate shape and faces the heating component. The fixing portion is attached to the heat sink and fixed to the circuit board at least at two points.

9 Claims, 11 Drawing Sheets

| | FOREIGN PATENT DOCUMENTS | | |
|---|---|---|---|
| JP | 2003017634 A * | 1/2003 | |
| JP | 2003-051573 | 2/2003 | |
| JP | 2004-071977 | 3/2004 | |
| JP | 2005-142292 | 6/2005 | |
| JP | 2005-166715 | 6/2005 | |
| JP | 2008-10768 | 1/2008 | |
| JP | 2009-070842 | 4/2009 | |
| JP | 2011-166024 | 8/2011 | |

OTHER PUBLICATIONS

Japanese Patent Application No. 2010-029220; Notice of Reasons for Rejection; Mailed Feb. 8, 2011 (with English translation).
Japanese Patent Application No. 2010-029220; Notice of Reasons for Rejection; Mailed May 10, 2011 (with English translation).

* cited by examiner

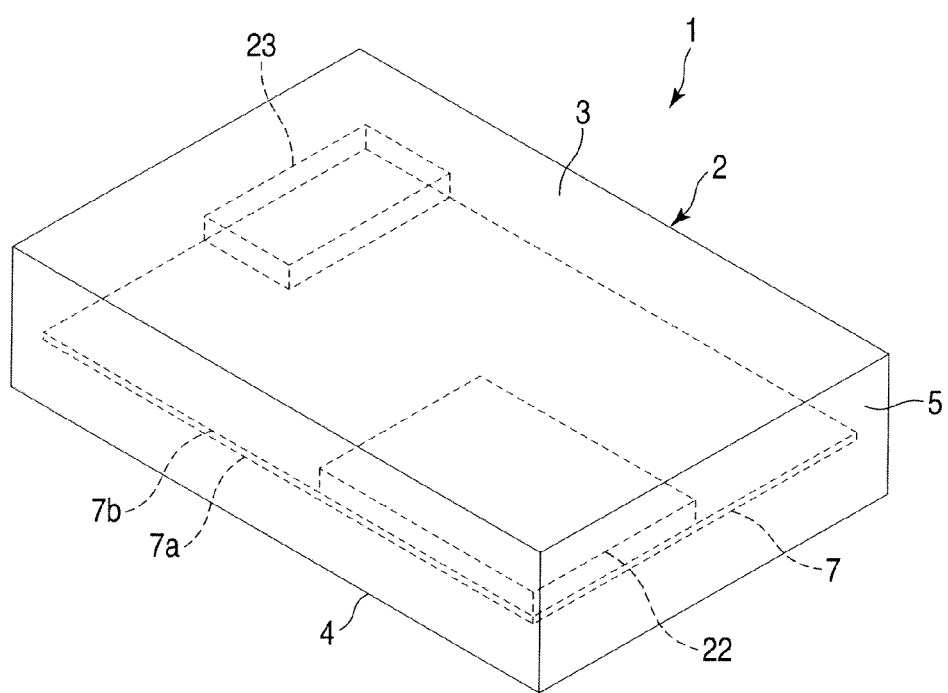
F I G. 1

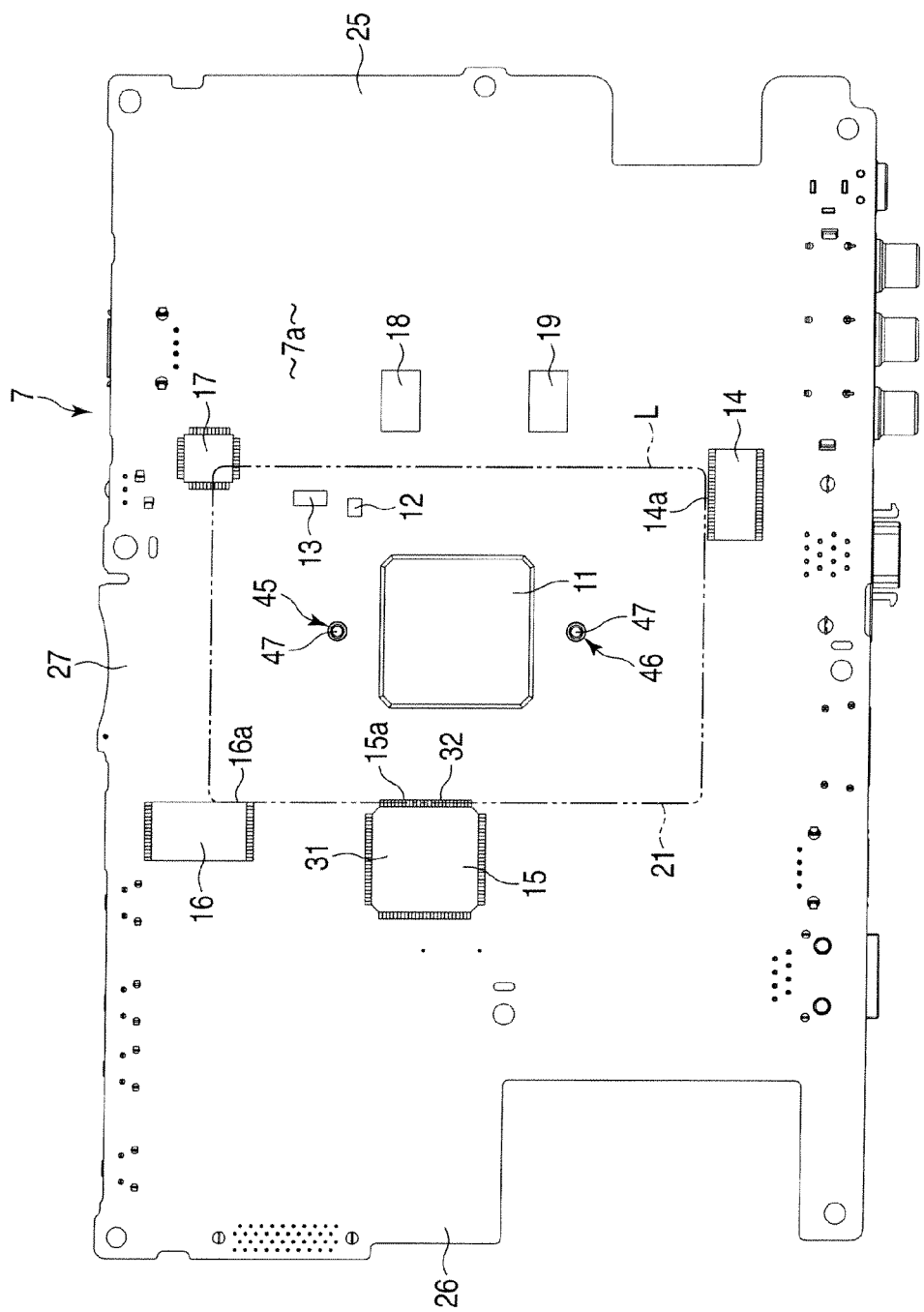
F I G. 2

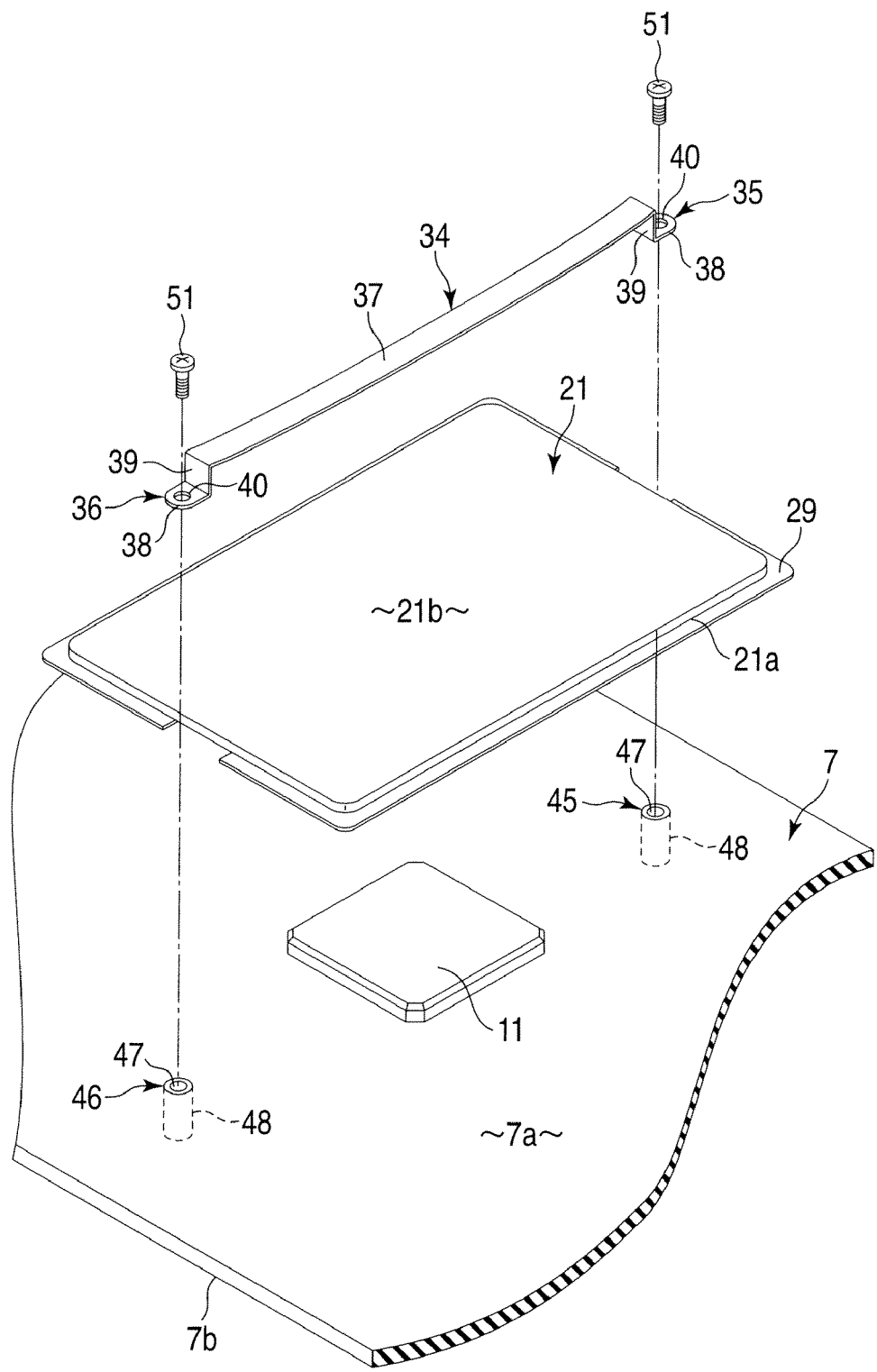
F I G. 10

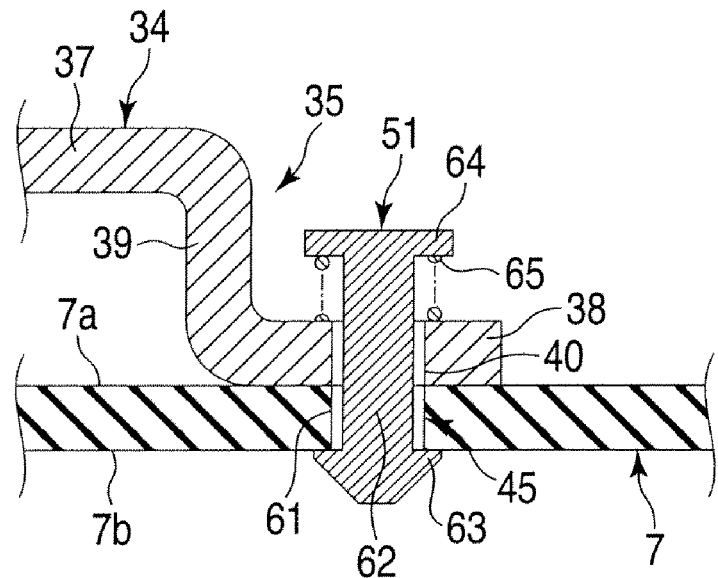
F I G. 11
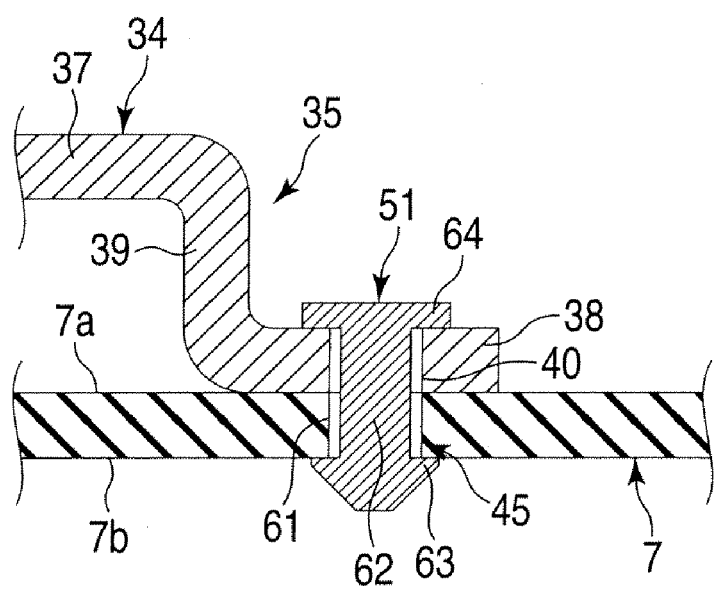
F I G. 12

ELECTRONIC APPARATUS

CROSS-REFERENCE TO RELATED APPLICATIONS

This application is based upon and claims the benefit of priority from Japanese Patent Application No. 2010-029220, filed Feb. 12, 2010; the entire contents of which are incorporated herein by reference.

FIELD

Embodiments described herein relate generally to an electronic apparatus comprising a heat sink.

BACKGROUND

A general heat sink comprises plural fins.

Jpn. Pat. Appln. KOKAI Publication No. 2003-51573 discloses a heat sink without any fin. The heat sink faces plural heating components. A hardened composition that deforms following the shape of the heating component or a variation in the height of heating component is interposed between the heat sink and the heating component.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 1 is an exemplary perspective view illustrating an electronic apparatus according to a first embodiment;

FIG. 2 is an exemplary diagram illustrating a lower surface of a circuit board shown in FIG. 1;

FIG. 10 is an exemplary perspective view illustrating a heat sink according to a third embodiment;

FIG. 11 is an exemplary cross-sectional view illustrating a fixing member according to a fourth embodiment; and FIG. 12 is an exemplary cross-sectional view illustrating a modification of the fixing member according to the fourth embodiment.

DETAILED DESCRIPTION

Figure 3:
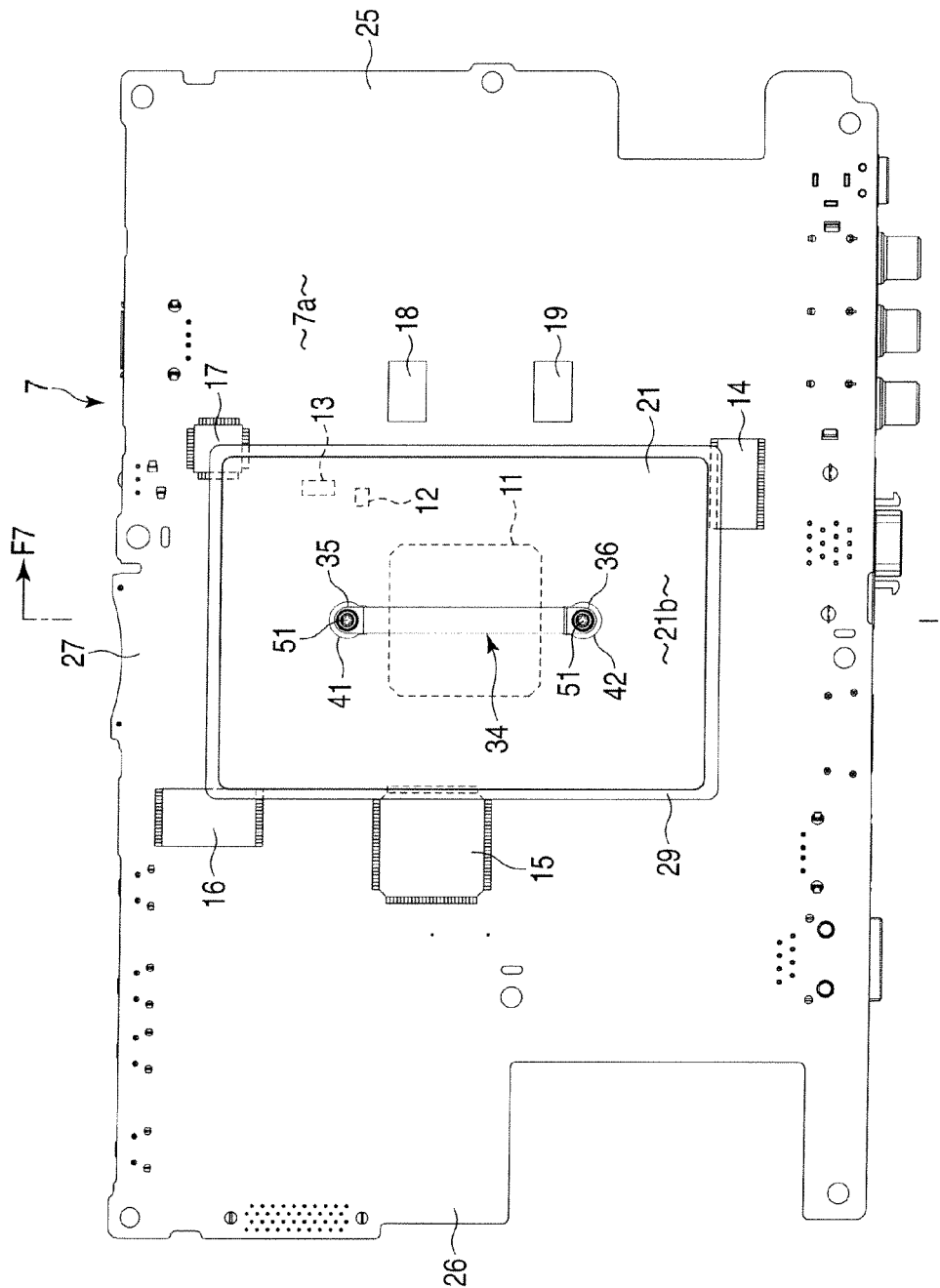
FIG. 3 is an exemplary diagram illustrating the lower surface of the circuit board shown in FIG. 2 to which a heat sink is attached.

Various embodiments will be described hereinafter with reference to the accompanying drawings.

In general, according to one embodiment, an electronic apparatus comprises a housing, a circuit board in the housing, a heat sink, and a fixing portion. The circuit board comprises a heating component. The heat sink has a plate shape and faces the heating component. The fixing portion is attached to the heat sink and fixed to the circuit board at least at two points.

Hereinafter, exemplary embodiments will be described with reference to FIGS. 1 to 12.

First Embodiment

FIG. 1 shows an electronic apparatus 1 according to a first embodiment. The electronic apparatus 1 is, for example, a television connecting device having a function of receiving various kinds of television programs. The electronic apparatus to which this embodiment can be applied is not limited thereto. This embodiment can be widely applied to various kinds of electronic apparatuses including a recording/reproducing apparatus, a notebook personal computer, a personal digital assistant (PDA), and a game machine.

As shown in FIG. 1, the electronic apparatus 1 comprises a housing 2 having a flat box shape. The housing 2 comprises an upper wall 3, a lower wall 4, and a circumferential wall 5. Each of the upper wall 3 and the lower wall 4 extends substantially in the horizontal direction. The circumferential wall 5 rises with respect to the lower wall 4 and connects the edge of the lower wall 4 and the edge of the upper wall 3. Leg portions 6 are attached to the lower wall 4. In this way, a gap g1 exists between the lower wall 4 and a mounting surface S.

As shown in FIG. 1, a circuit board 7 is contained in the housing 2. The circuit board 7 comprises, for example, a first surface 7a, which is the lower surface, and a second surface 7b, which is the upper surface. As shown in FIG. 2, for example, a central processing unit (CPU) 11, a field effect transistor (FET) 12, a power regulator 13, a VIDEO driver 14, low voltage differential signals (LVDS) 15, a NAND flash memory 16, a microcomputer 17, and main memories 18 and 19 are mounted on the first surface 7a.

The CPU 11 is an example of a "heating component" and the amount of heat generated by the CPU 11 is more than that of other electronic components. The example of the "heating component" is not limited to the CPU 11. For example, various kinds of components requiring heat dissipation, such as a graphic chip and North Bridge (trademark), may be appropriately used as the heating component.

Each of the FET 12 and the power regulator 13 is an example of a "first electronic component". The FET 12 and the power regulator 13 have a height smaller than that of the CPU 11, that is, a small mounting height. The FET 12 and the power regulator 13 are arranged relatively close to the CPU 11.

Each of the VIDEO driver 14, the LVDS 15, the NAND flash memory 16, the microcomputer 17, and the main memories 18 and 19 is an example of a "second electronic component". The VIDEO driver 14 is an IC for analog image output. The LVDS 15 is an IC for image output. The NAND flash memory 16 stores a main program. The microcomputer 17 performs an IR remote control process and power management. The size of the second electronic component is larger than that of the first electronic component.

The VIDEO driver 14, the LVDS 15, the NAND flash memory 16, the microcomputer 17, and the main memories 18 and 19 are arranged relatively far away from the CPU 11 so as to avoid the neighborhood of the CPU 11. For example, they are arranged further away from the CPU 11 than the first electronic components are.

In FIG. 2, a two-dot chain line L indicates the outline of a heat sink 21, which will be described below. The FET 12 and the power regulator 13, which are the first electronic components, are arranged in the heat sink 21, that is, inside the outline of the heat sink 21.

The VIDEO driver 14, the LVDS 15, the NAND flash memory 16, the microcomputer 17, and the main memories 18 and 19 are arranged in a region outside the heat sink 21, that is, a region outside the outline of the heat sink 21, or a region that partially overlaps the outline of the heat sink 21. That is, the first electronic components with a relatively small height and a small size are arranged in the heat sink 21, and the second electronic components with a relatively large size are arranged outside the heat sink 21.

Figure 6:
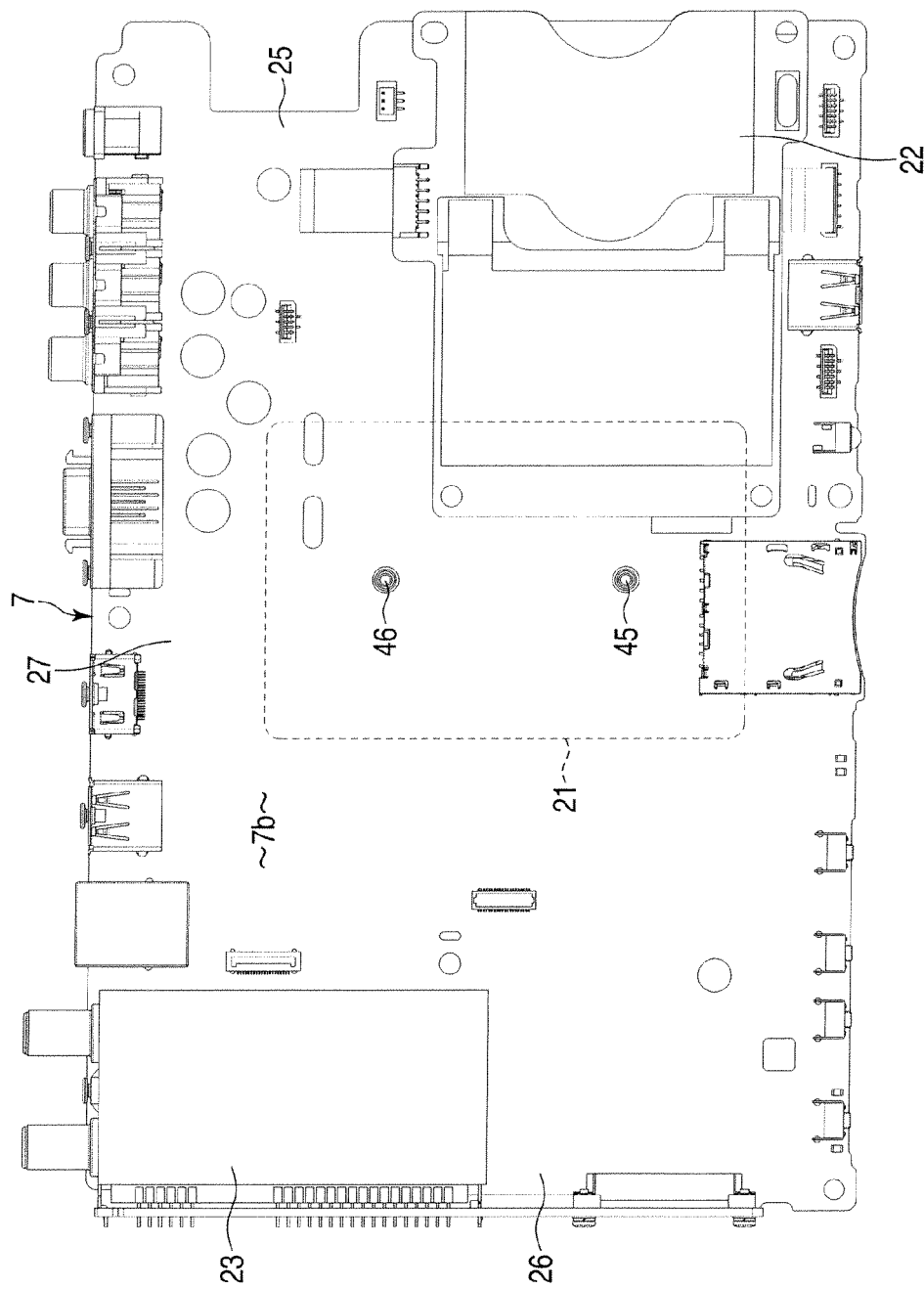
FIG. 6 is an exemplary plan view illustrating the circuit board shown in FIG. 1.

As shown in FIG. 6, a BS-condition access system (B-CAS) card slot 22 and a tuner module 23 are mounted on the second surface 7b of the circuit board 7. The circuit board 7 has a rectangular shape. The B-CAS card slot 22 is arranged in a first end portion 25 of the circuit board 7 in the longitudinal direction of the circuit board 7.

The tuner module 23 is in a second end portion 26 of the circuit board 7, which is opposite to the first end portion 25, in the longitudinal direction of the circuit board 7. Each of the B-CAS card slot 22 and the tuner module 23 is an example of a "heating portion". That is, heat is likely to be generated from the first end portion 25 and the second end portion 26 of the circuit board 7 due to the B-CAS card slot 22 and the tuner module 23. Meanwhile, the CPU 11 and the heat sink 21 are in a central portion 27 between the first end portion 25 and the second end portion 26 of the circuit board 7.

Figure 4:
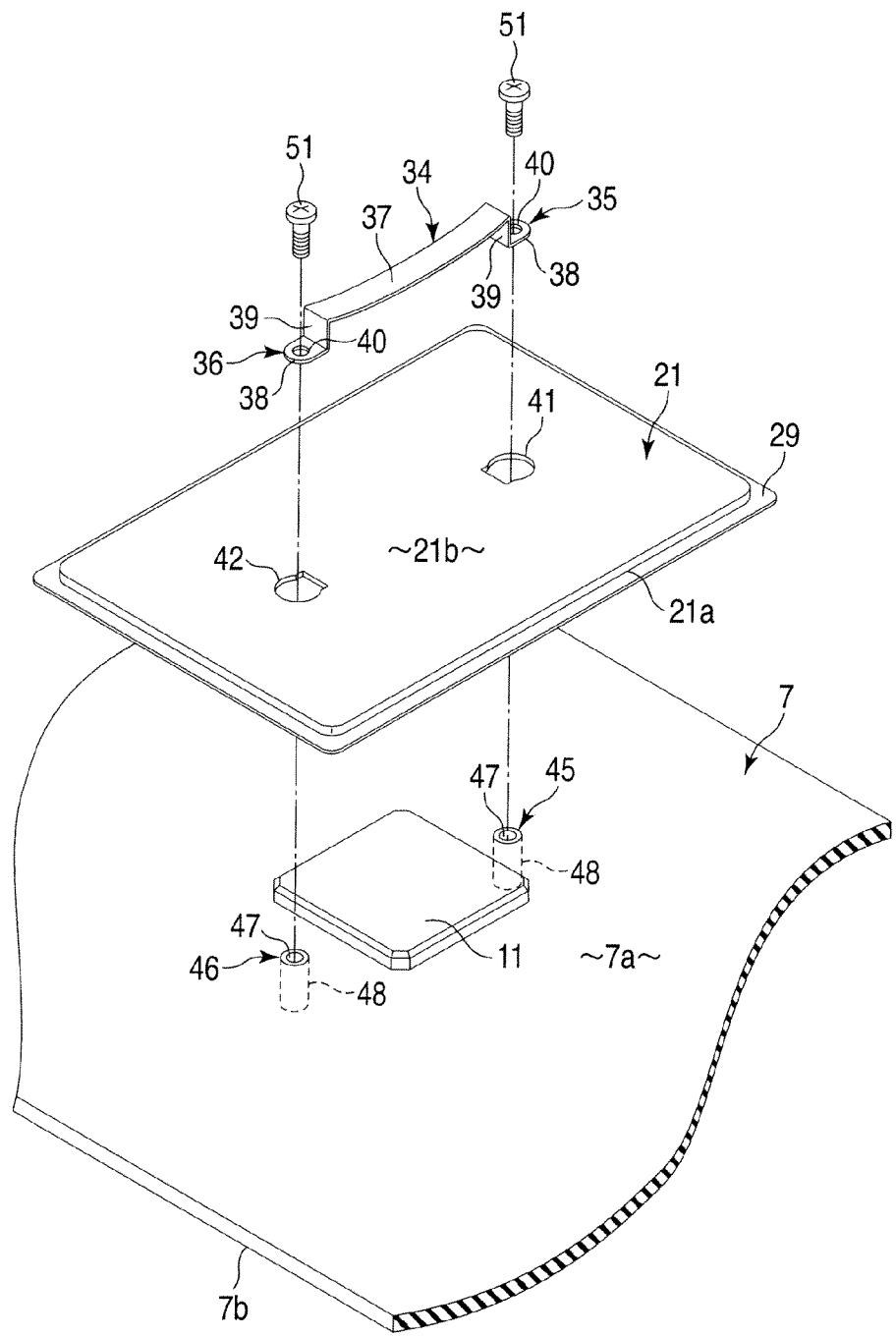
FIG. 4 is an exemplary exploded perspective view illustrating the circuit board and the heat sink shown in FIG. 3.
Figure 7:
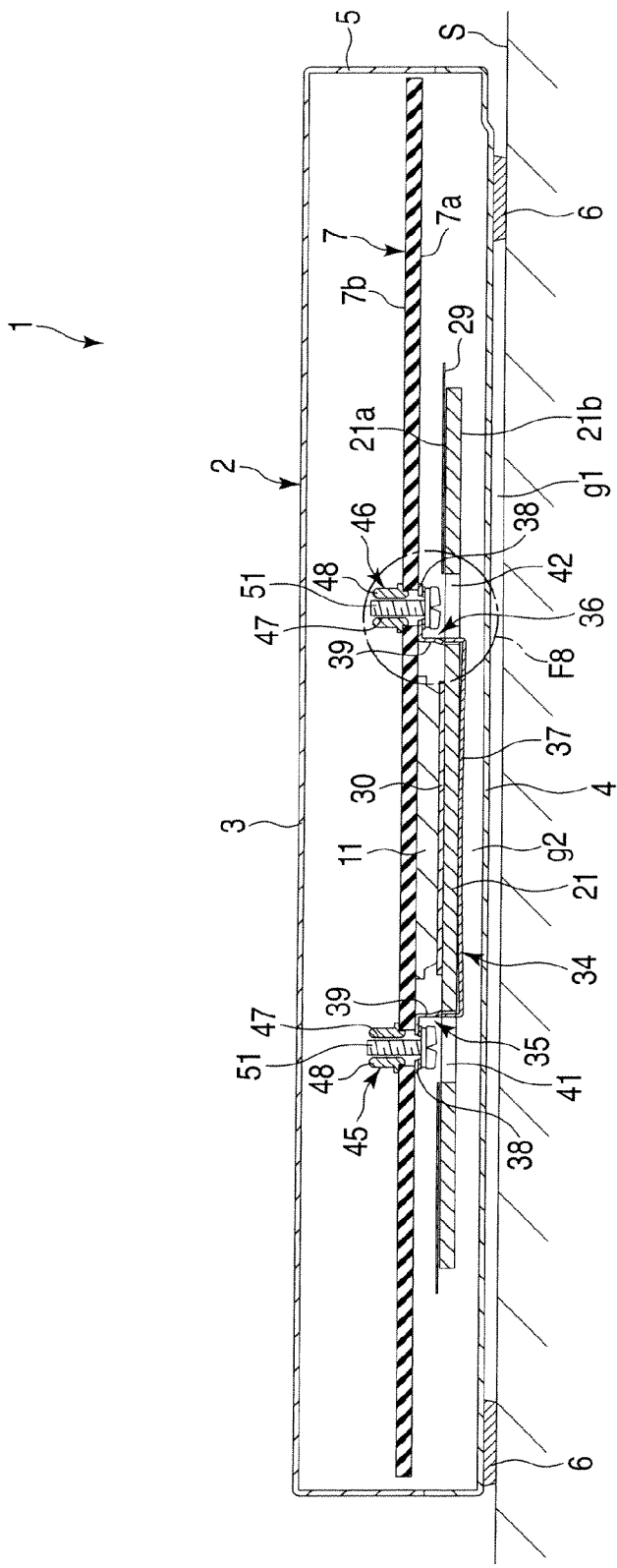
FIG. 7 is an exemplary cross-sectional view illustrating the heat sink taken along the line F7-F7 of FIG. 3.

As shown in FIGS. 4 and 7, a thin plate heat sink 21 (hereinafter, simply referred to as the heat sink 21) is attached to the circuit board 7. The heat sink 21 is a rectangular plate without any fin. The heat sink 21 is made of, for example, a metal plate with high thermal conductivity, such as aluminum alloy.

Figure 5:
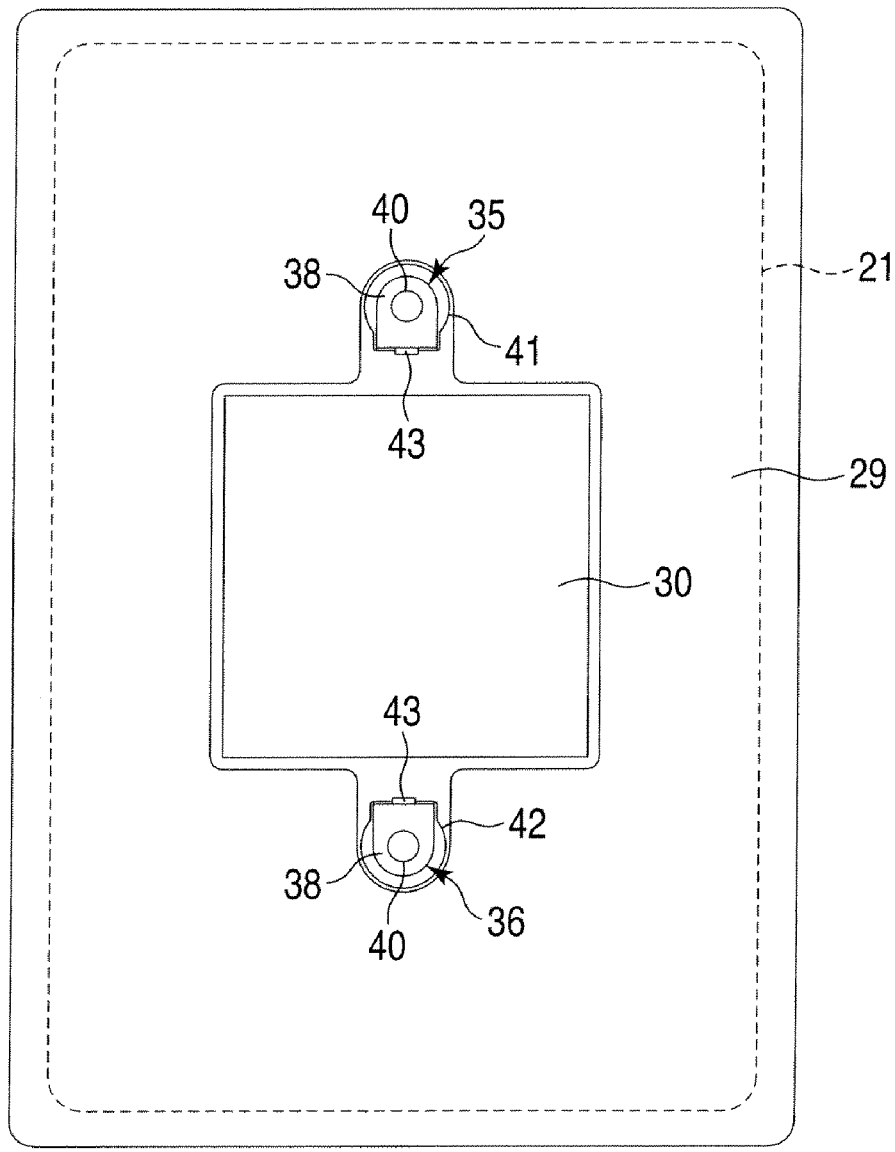
FIG. 5 is an exemplary plan view illustrating a rear surface of the heat sink shown in FIG. 4.

As shown in FIG. 7, the heat sink 21 comprises a first surface 21a facing the circuit board 7 and a second surface 21b opposite to the first surface 21a. An insulator 29 is attached to the first surface 21a. The insulator 29 is made of an insulating material. As shown in FIG. 5, for example, the insulator 29 is larger than the heat sink 21 and covers substantially the entire surface of the heat sink 21.

As shown in FIGS. 3 and 7, the heat sink 21 faces the CPU 11. For example, the heat sink 21 is thermally connected to the CPU 11 through a thermally conductive sheet 30. In this way, the heat sink 21 receives heat from the CPU 11 and diffuses the heat to the entire surface of the heat sink 21, thereby accelerating the heat dissipation of the CPU 11. The heat sink 21 may be thermally connected to the CPU 11 through, for example, thermally conductive grease, instead of the thermally conductive sheet 30.

The heat sink 21 has a shape substantially symmetric with respect to the center of the CPU 11 in all directions. As described above, the heat sink 21 is in the central portion 27 of the circuit board 7. The longitudinal direction of the heat sink 21 is substantially aligned with the lateral direction (i.e., a direction perpendicular to the longitudinal direction) of the circuit board 7.

The size of the heat sink 21 is relatively larger than that of the CPU 11. The heat sink 21 extends to a region that overlaps other electronic components and faces the FET 12 and the power regulator 13 which are the first electronic components. A gap exists between the heat sink 21, and the FET 12 and the power regulator 13.

As shown in FIG. 2, the heat sink 21 is adjacent to, for example, the side of the VIDEO driver 14, the side of the LVDS 15, and the side of the NAND flash memory 16. That is, an edge portion 14a of the VIDEO driver 14, an edge portion 15a of the LVDS 15, and an edge portion 16a of the NAND flash memory 16, which are all straight lines, extend along the outline L of the heat sink 21. The LVDS 15 comprises a main portion 31 and leads 32. For example, the heat sink 21 does not face the main portion 31 of the LVDS 15, but faces the leads 32.

As shown in FIGS. 3 and 4, a fixing member 34 for fixing the heat sink 21 is attached to the heat sink 21. The fixing member 34 is fixed to the circuit board 7 at least at two points. The fixing member 34 according to this embodiment is provided separately from the heat sink 21 and is an elongated metal plate. The fixing member 34 comprises a first fixing portion 35, a second fixing portion 36, and a pressing portion 37.

The first fixing portion 35 and the second fixing portion 36 are aligned in the longitudinal direction of the heat sink 21. Each of the first fixing portion 35 and the second fixing portion 36 is a leg portion fixed to the circuit board 7 and comprises a fixing portion main part 38 parallel to the circuit board 7 and a rising part 39 that rises from an end portion of the fixing portion main part 38. A through hole 40 is in the fixing portion main part 38.

The pressing portion 37 is a main portion of the fixing member 34 that connects the first fixing portion 35 and the second fixing portion 36 and has, for example, an arc shape with small curvature. The pressing portion 37 extends in the longitudinal direction of the heat sink 21. The pressing portion 37, the first fixing portion 35, and the second fixing portion 36 cooperate with each other such that the fixing member 34 functions as a leaf spring. The pressing portion 37 presses the heat sink 21 against the CPU 11 to improve the adhesion between the heat sink 21 and the CPU 11.

As shown in FIG. 4, the heat sink 21 comprises a first opening portion 41 corresponding to the first fixing portion 35 and a second opening portion 42 corresponding to the second fixing portion 36. The first fixing portion 35 and the second fixing portion 36 pass through the first opening portion 41 and the second opening portion 42, respectively. The pressing portion 37 faces the second surface 21b of the heat sink 21 at a position that overlaps the CPU 11.

Figure 8:
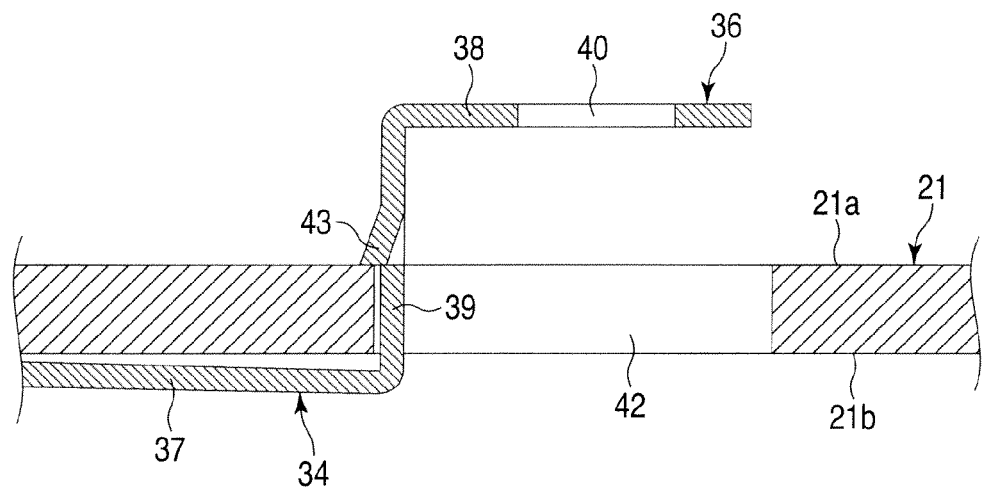
FIG. 8 is an exemplary enlarged cross-sectional view illustrating a region surrounded by a one-dot chain line F8 in a fixing member shown in FIG. 7.

The fixing member 34 is engaged with the heat sink 21 and can be treated integrally with the heat sink 21. Specifically, as shown in FIG. 8, the rising part 39 of each of the first fixing portion 35 and the second fixing portion 36 comprises a protrusion 43 that protrudes toward the edge of opening portion 41 or 42. When the first fixing portion 35 and the second fixing portion 36 are inserted into the opening portions 41 and 42, the protrusions 43 are engaged with the first surface 21a of the heat sink 21.

In this way, the fixing member 34 is integrated with the heat sink 21. When the fixing member 34 is integrated with the heat sink 21, it is not necessary to individually position the fixing member 34 and the heat sink 21 during an assembly process. Therefore, assemblability is improved.

As shown in FIG. 2, the circuit board 7 comprises a first attachment portion 45 to which the first fixing portion 35 is fixed and a second attachment portion 46 to which the second fixing portion 36 is fixed. The first attachment portion 45 and the second attachment portion 46 are separately arranged on both sides of the CPU 11 and are aligned in the lateral direction of the circuit board 7.

The first attachment portion 45 and the second attachment portion 46 are in the vicinity of the CPU 11. For example, the first attachment portion 45 and the second attachment portion 46 are disposed closer to the CPU 11 than the first electronic components are.

Each of the first attachment portion 45 and the second attachment portion 46 comprises a screw hole 47. The first attachment portion 45 and the second attachment portion 46 are formed by, for example, studs 48 vertically provided on the second surface 7b of the circuit board 7.

As shown in FIG. 4, the first fixing portion 35 and the second fixing portion 36 are respectively fixed to the first attachment portion 45 and the second attachment portion 46 by, for example, attachment members 51, such as screws. That is, the attachment members 51 are inserted into the through holes 40 of the first fixing portion 35 and the second fixing portion 36 and the attachment members 51 are engaged with the screw holes 47 to fix the fixing member 34.

In this way, the first fixing portion 35 and the second fixing portion 36 are fixed to the inner region of the heat sink 21. That is, the first fixing portion 35 and the second fixing portion 36 are fixed to the circuit board 7 at a position closer to the CPU 11 than the outline of the heat sink 21. The first fixing portion 35 and the second fixing portion 36 are disposed closer to the CPU 11 than the first electronic components.

As shown in FIG. 7, for example, a gap g2 of several millimeters exists between the heat sink 21 and the lower wall 4 of the housing 2. In this way, the heat of the heat sink 21 is not directly transferred to the lower wall 4. Therefore, an increase in the temperature of a portion of the lower wall 4 is prevented.

According to this structure, it is possible to reduce the thickness of an electronic apparatus.

That is, since the heat sink 21 is formed on a plate without any fin, it is possible to reduce the thickness of a heat radiating structure. In this way, it is possible to reduce the thickness of the electronic apparatus 1.

When the size of the heat sink 21 is relatively larger than that of the CPU 11 and the heat sink 21 extends to a region facing the first electronic components, it is easy to ensure a good heat radiating performance even when the thin plate heat sink 21 is used.

For example, the heat sink 21 is likely to be inclined during assembly or due to a cause after assembly. However, when the insulator 29 is attached to the heat sink 21 as in this embodiment, the insulator 29 comes into contact with, for example, the first electronic component to prevent a short circuit between the heat sink 21 and the first electronic component. In this way, it is possible to appropriately protect the first electronic component.

The heat sink 21 having a rectangular shape is more likely to be wobbled in the longitudinal direction than in the lateral direction thereof. Therefore, when the first fixing portion 35 and the second fixing portion 36 are aligned in the longitudinal direction of the heat sink 21, the heat sink 21 is fixed at two points in the longitudinal direction of the heat sink 21. As a result, the heat sink 21 is less likely to be wobbled.

When the first fixing portion 35 and the second fixing portion 36 are fixed to the circuit board 7 inside the heat sink 21, it is easy to reduce the distance between the first fixing portion 35 and the second fixing portion 36. When the distance between the first fixing portion 35 and the second fixing portion 36 is small, it is easy to set the center of pressure against the CPU 11 or adjust pressing force, and it is possible to appropriately press the heat sink 21 against the CPU 11.

For example, components having a height smaller than that of the CPU 11 are mainly arranged within the heat sink 21. Therefore, there are many restrictions in mounting components. Meanwhile, there are less restrictions in mounting components outside the heat sink 21. Therefore, when the first fixing portion 35 and the second fixing portion 36 are arranged inside the heat sink 21, it is possible to effectively use a mounting area outside the heat sink 21 where there are less restrictions in mounting components. This contributes to improving mounting density.

In this embodiment, the heat sink 21 comprises the first opening portion 41 and the second opening portion 42, and the first fixing portion 35 and the second fixing portion 36 of the fixing member 34 are attached to the circuit board 7 through the first opening portion 41 and the second opening portion 42. According to this structure, it is possible to form the fixing member 34 separately from the heat sink 21 and arrange the first fixing portion 35 and the second fixing portion 36 in the heat sink 21 with a relatively simple structure.

When the heat sink 21 is adjacent to the side of the second electronic component, it is possible to increase the size of the heat sink 21 in a region that does not overlap the second electronic component. In this way, it is possible to increase the heat radiating area of the heat sink 21 and improve the heat radiating performance of the thin heat sink 21.

When the second electronic component with a relatively large size is arranged in the heat sink 21, the fluidity of air between the circuit board 7 and the heat sink 21 is reduced and the heat of the heat sink 21 is less likely to be dissipated. However, as in this embodiment, when the first electronic component with a relatively small size is arranged in the heat sink 21 and the second electronic component with a relatively large size is arranged outside the heat sink 21, it is possible to achieve a structure capable of easily radiating the heat of the heat sink 21. This contributes to improving the cooling performance of the electronic apparatus 1.

Since the heat sink 21 does not face the main portion 31 of the second electronic component, but faces only the leads 32, it is possible to increase the size of the heat sink 21 in a region that does not overlap a portion of the second electronic component with a large height. In this way, it is possible to increase the area of the heat sink 21 and further improve the heat radiating performance of the thin heat sink 21.

The circuit board 7 comprises the B-CAS card slot 22 and the tuner module 23, which are heating portions, at both end portions thereof in the longitudinal direction of the circuit board 7. If the longitudinal direction of the heat sink 21 is substantially aligned with the longitudinal direction of the circuit board 7, the heat of the heat sink 21 is transferred to end portions 25 and 26 of the circuit board 7 in the longitudinal direction of the circuit board 7. As a result, the temperature of end portions 25 and 26 is likely to increase.

However, in this embodiment, the longitudinal direction of the heat sink 21 is substantially aligned with the lateral direction of the circuit board 7. According to this structure, the heat of the heat sink 21 is less likely to be transferred to an end portion of the circuit board 7 in the longitudinal direction of the circuit board 7. Therefore, it is possible to suppress an increase in the temperature of a portion of the circuit board 7.

Second Embodiment

Next, an electronic apparatus 1 according to a second embodiment will be described with reference to FIG. 9. Components having the same or similar functions as those in the first embodiment are denoted by the same reference numerals and a description thereof will be omitted. In addition, structures other than the following structures are the same as those in the first embodiment.

Figure 9:
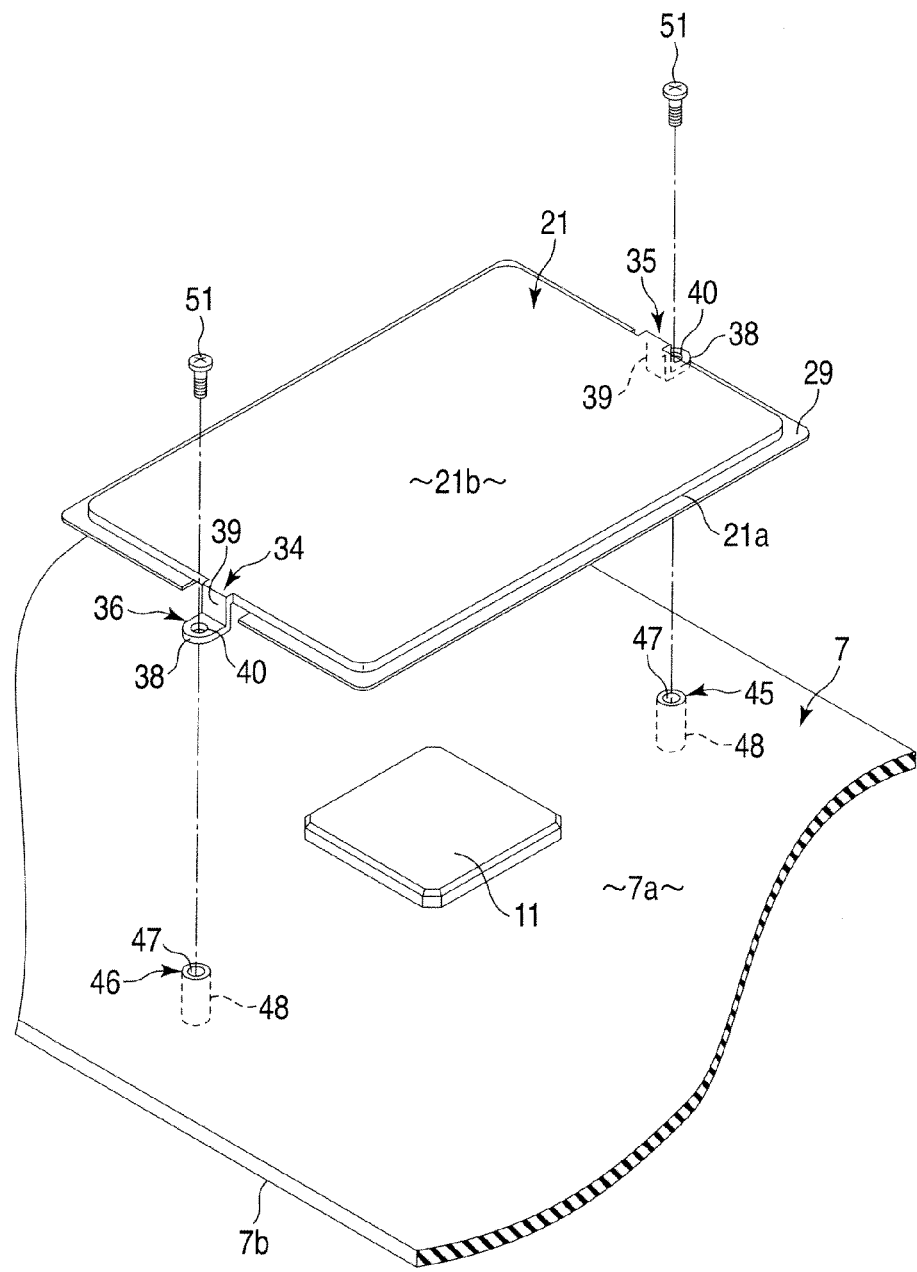
FIG. 9 is an exemplary perspective view illustrating a heat sink according to a second embodiment.

As shown in FIG. 9, the fixing member 34 according to this embodiment is a metal plate formed integrally with the heat sink 21 and is an example of a "fixing portion". The first fixing portion 35 and the second fixing portion 36 are separately at both ends of the heat sink 21 in the longitudinal direction of the heat sink 21.

According to this structure, similar to the first embodiment, it is possible to reduce the thickness of an electronic apparatus. When the fixing member 34 is formed integrally with the heat sink 21, it is possible to reduce the number of components.

Third Embodiment

Next, an electronic apparatus 1 according to a third embodiment will be described with reference to FIG. 10. Components having the same or similar functions as those in the first embodiment are denoted by the same reference numerals and a description thereof will be omitted. In addition, structures other than the following structures are the same as those in the first embodiment.

As shown in FIG. 10, the fixing member 34 according to this embodiment is formed so as to be longer than the heat sink 21 in the longitudinal direction of the heat sink 21. The first fixing portion 35 and the second fixing portion 36 are fixed to the circuit board 7 outside the heat sink 21 on both sides of the heat sink 21 in the longitudinal direction.

According to this structure, similar to the first embodiment, it is possible to reduce the thickness of an electronic apparatus.

Fourth Embodiment

Next, an electronic apparatus 1 according to a fourth embodiment will be described with reference to FIG. 11. Components having the same or similar functions as those in the first embodiment are denoted by the same reference numerals and a description thereof will be omitted. In addition, structures other than the following structures are the same as those in the first embodiment.

As shown in FIG. 11, the attachment member 51 according to this embodiment is, for example, a pin member, such as a rivet. A through hole 61 communicating with the through hole 40 of the fixing member 34 is in the circuit board 7. The attachment member 51 comprises a main portion 62 inserted into the through holes 40 and 61, a first end portion 63 engaged with the second surface 7b of the circuit board 7, and a second end portion 64 facing the first fixing portion 35 or the second fixing portion 36 of the fixing member 34.

The fixing member 34 according to this embodiment does not have elasticity. Alternatively, for example, an elastic member 65, such as a coil spring, is interposed between the fixing member 34 and the second end portion 64 of the attachment member 51. The fixing member 34 presses the heat sink 21 against the CPU 11 by the elastic force of the elastic member 65.

According to this structure, similar to the first embodiment, it is possible to reduce the thickness of an electronic apparatus. In addition, the attachment member 51 according to this embodiment makes it easy to assemble an electronic apparatus and improve productivity. As shown in FIG. 12, the attachment member 51 may not comprise the coil spring.

The electronic apparatuses 1 according to the first to fourth embodiments have been described above, but the embodiments are not limited thereto. The components according to the first to fourth embodiments may be appropriately combined with each other. The invention is not limited to the above-described embodiments, but various modifications and changes of the embodiments can be made without departing from the scope and spirit of the invention.

In the above-described embodiments, the fixing member 34 is fixed at two points, but the embodiments are not limited thereto. The fixing member 34 may be fixed at three or more points. In the above-described embodiments, the heat sink 21 is thermally connected to only one heating component, but the embodiments are not limited thereto. The heat sink 21 may be thermally connected to two or more heating components. In the above-described embodiments, for example, plural second electronic components are on the circuit board 7. The heat sink only needs to be adjacent to the side of at least one of the plural second electronic components.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing;
a circuit board in the housing, comprising a heating component and an electronic component;
a heat sink shaped as a plate comprising a first opening and a second opening, and facing the heating component and the electronic component, and thermally connected to the heating component;
a fixing member comprising a first fixing portion in the first opening, a second fixing portion in the second opening, and a pressing portion between the first fixing portion and the second fixing portion, the pressing portion pressing the heat sink, the fixing member fixed to the circuit board at a position closer to the heating component than an outline of the heat sink; and
an insulator comprising a portion outside an external edge of the heat sink, the insulator attached to a surface of the heat sink, the surface facing the circuit board.

2. The electronic apparatus of claim 1,
wherein
the first fixing portion and the second fixing portion are aligned in a longitudinal direction of the heat sink.

3. The electronic apparatus of claim 1,
wherein the insulator comprises a portion outside the first fixing portion.

4. The electronic apparatus of claim 1,
wherein the electronic component is smaller than the heating component in height.

5. The electronic apparatus of claim 1,
wherein the first fixing portion is closer to the heating component than to the electronic component.

6. An electronic apparatus comprising:
a housing;
a circuit board in the housing, comprising a heating component and an electronic component;
a heat sink shaped as a plate comprising a first opening and a second opening, and facing the heating component and the electronic component, and thermally connected to the heating component;
an insulator attached to the heat sink and covering a portion of the circuit board; and a fixing member comprising a first fixing portion in the first opening, a second fixing portion in the second opening, and a pressing portion between the first fixing portion and the second fixing portion, the pressing portion pressing the heat sink, the fixing member fixed to the circuit board at a position closer to the heating component than an external edge of the heat sink.

7. The electronic apparatus of claim 6,
wherein the electronic component is smaller than the heating component in height.

8. The electronic apparatus of claim 6,
wherein the first fixing portion and the second fixing portion are aligned in a longitudinal direction of the heat sink.

9. The electronic apparatus of claim 6,
wherein the first fixing portion is closer to the heating component than to the electronic component.

* * * * *